United States Patent
Shako et al.

(10) Patent No.: US 7,418,058 B2
(45) Date of Patent: Aug. 26, 2008

(54) DISTORTION COMPENSATING APPARATUS AND METHOD

(75) Inventors: Hideharu Shako, Kawasaki (JP); Yasuhito Funyu, Kawasaki (JP); Takeshi Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 60 days.

(21) Appl. No.: 11/504,503

(22) Filed: Aug. 15, 2006

(65) Prior Publication Data

US 2007/0253566 A1  Nov. 1, 2007

(30) Foreign Application Priority Data

Apr. 17, 2006  (JP) ............................ 2006-113309

(51) Int. Cl.
  *H04L 25/49* (2006.01)
  *H03C 3/08* (2006.01)
  *H03C 1/06* (2006.01)

(52) U.S. Cl. .................. 375/296; 375/297; 332/124; 332/160

(58) Field of Classification Search ......... 332/123–125, 332/159, 149, 160, 161; 375/295–297; 455/91, 455/114.2
  See application file for complete search history.

(56) References Cited

U.S. PATENT DOCUMENTS

| | | | | |
|---|---|---|---|---|
| 5,404,378 | A * | 4/1995 | Kimura | 375/296 |
| 6,864,745 | B2 * | 3/2005 | Ode et al. | 330/149 |
| 7,102,969 | B2 * | 9/2006 | Tsukamoto et al. | 369/47.5 |
| 7,106,133 | B2 * | 9/2006 | Hamada et al. | 330/149 |
| 7,215,717 | B2 * | 5/2007 | Doi | 375/297 |
| 7,242,247 | B2 * | 7/2007 | Hirose et al. | 330/149 |
| 2003/0080814 | A1 * | 5/2003 | Ode et al. | 330/149 |
| 2003/0184372 | A1 | 10/2003 | Fudaba et al. | |
| 2004/0116083 | A1 | 6/2004 | Suzuki et al. | |
| 2004/0212428 | A1 * | 10/2004 | Ode et al. | 330/149 |

FOREIGN PATENT DOCUMENTS

| EP | 1 511 181 | 3/2005 |
|---|---|---|
| JP | 2005-65211 | 3/2005 |

OTHER PUBLICATIONS

European Search Report dated May 28, 2008, from the corresponding European Application.

Ernesto G. Jeckeln, et al. "A New Adaptive Predistortion Technique Using Software-Defined Radio and DSP Technologies Suitable for Base Station 3G Power Amplifiers" IEEE Transactions on Microwave Theory and Techniques, vol. 52, No. 9, Sep. 1, 2004, pp. 2139-2147.

* cited by examiner

*Primary Examiner*—Tesfaldet Bocure
(74) *Attorney, Agent, or Firm*—Katten Muchin Rosenman LLP

(57) ABSTRACT

The present apparatus includes: distortion amount detector which detects the amount of distortion of an output signal of the amplifier; parameter holder; parameter corrector which corrects a parameter held in the parameter holder in such a manner that the distortion amount detected by the distortion amount detector is improved; controller which controls frequency components to be subjected to distortion amount detection that is performed by the distortion amount detector, based on the distortion amounts of a plurality of different frequency components of the output signal of the amplifier and on specification values relating to the distortion amounts. This arrangement makes it possible to set (control) appropriate distortion data measurement point (frequency component to be detected) according to multiple specification values (for example, ACLR specification values) relating to the distortion amount.

16 Claims, 12 Drawing Sheets

TO STEP S32 OF FIG. 3

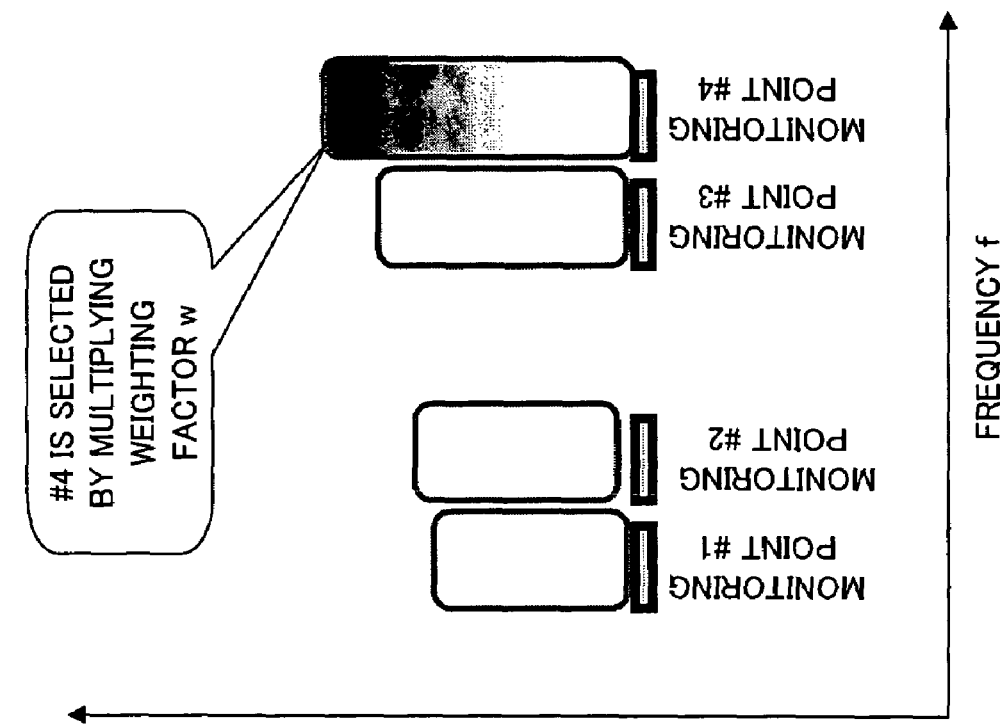
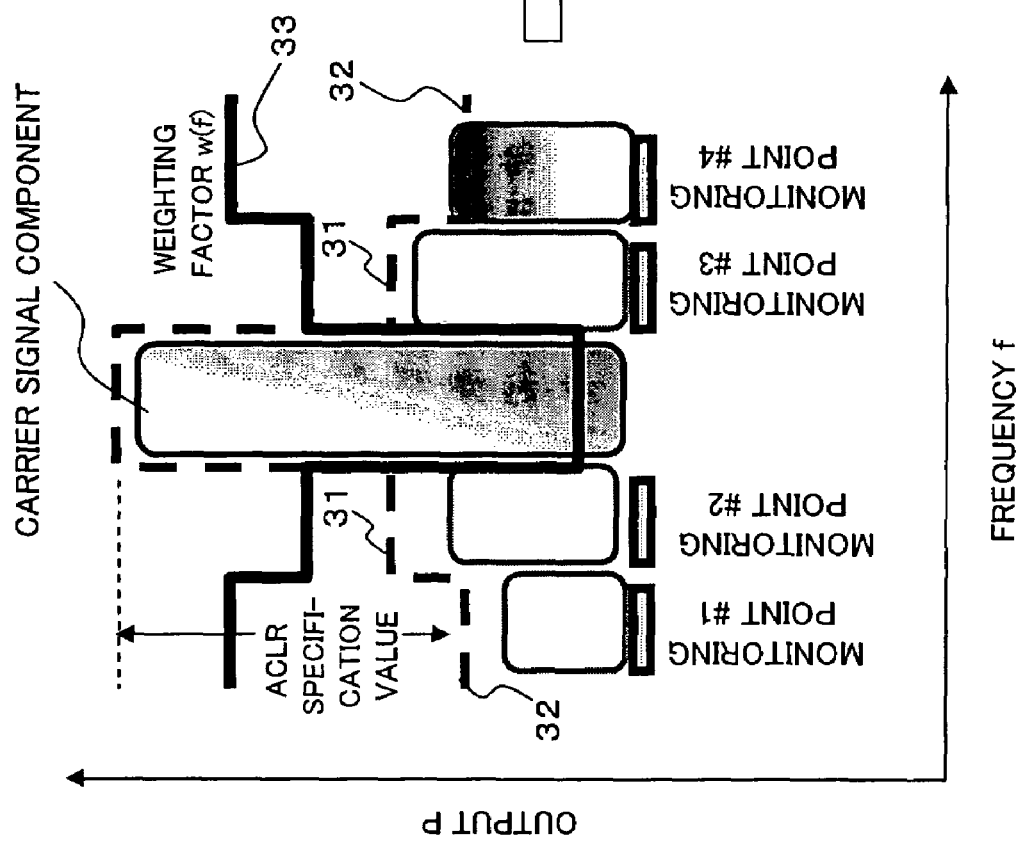

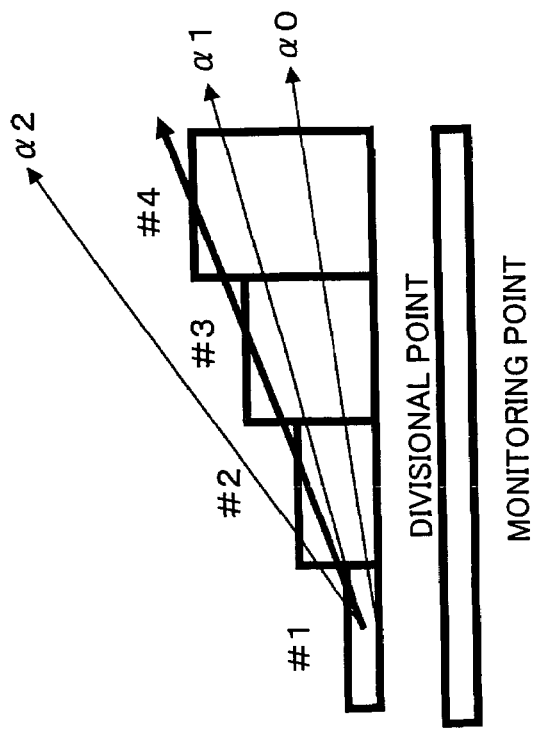
FIG. 6(C)
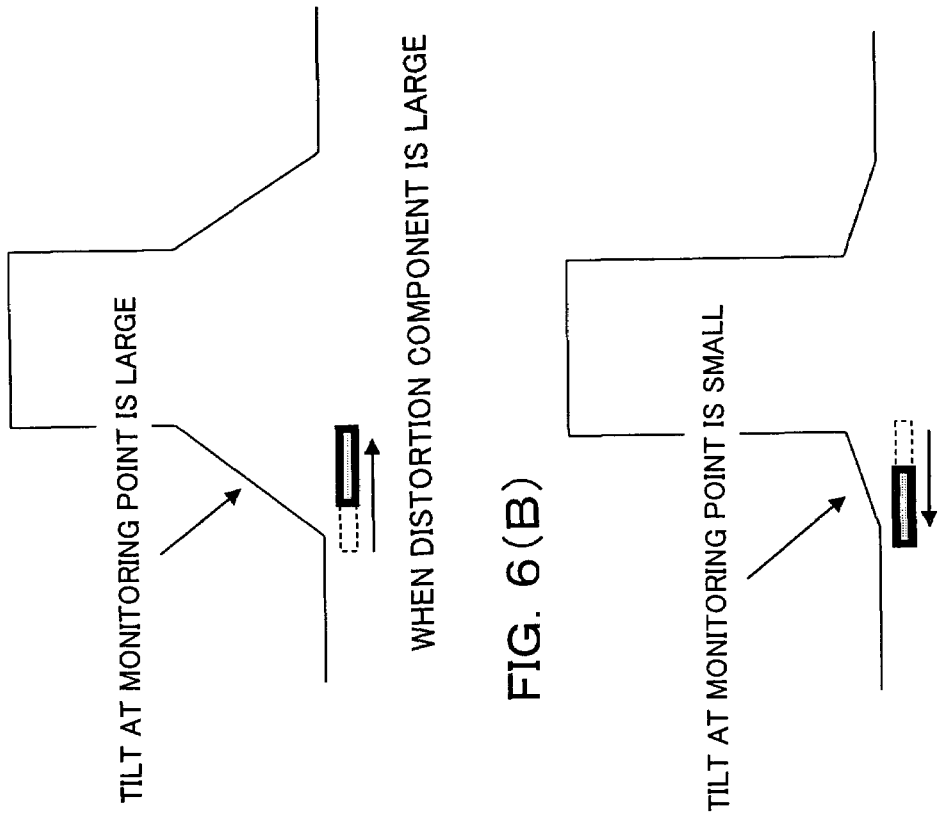
FIG. 6(A)
FIG. 6(B)

DISTORTION COMPENSATING APPARATUS AND METHOD

CROSS REFERENCE TO RELATED APPLICATIONS

This application is based on and hereby claims priority to Japanese Application No. 2006-113309 filed on Apr. 17, 2006 in Japan, the contents of which are hereby incorporated by reference.

BACKGROUND OF THE INVENTION (1) Field of the Invention

The present invention relates to a distortion compensating apparatus and a distortion compensating method. The invention relates particularly to an art suitable for use in a predistortion amplifier which compensates for nonlinearity of an amplifier by adaptively updating a distortion compensation coefficient for an input signal input to the amplifier based on a difference between input and output signals.

(2) Description of the Related Art

FIG. 7 is a block diagram showing a construction of an important part of a previous Digital Predistortion (DPD) amplifier. The DPD amplifier of FIG. 7 includes: a Lookup Table (LUT: a distortion compensation table) 110; an address generator 111; an LMS arithmetic operator (distortion compensation arithmetic operation unit) 112; a multiplier 113; an equalizer filter (complex filter) 114; a digital/analogue (D/A) converter 115; a Quadrature Modulating unit (QMOD) 116; a local oscillator 117; an amplifier 118; a directional coupler 119; a mixer (multiplier) 120; a local oscillator 121; an analogue/digital (A/D) converter 122; a 1/M clock (CLK)-unit delay circuit 123; a clock (CLK)-unit delay circuit 124; and a subtracter 125; an FFT arithmetic operator 126; an integrator 127; a bus 128; and a CPU 129.

In the DPD amplifier with such a construction, a complex signal X(I, Q), composed of an I signal and a Q signal, is input as an input signal (digital signal). The multiplier 113 multiplies the complex signal X(I, Q) by a distortion compensation coefficient given by the distortion compensation table 110, thereby performing distortion compensation, and the complex signal X(I, Q) is input to the equalizer filter 114. In this instance, the above complex signal X(I, Q) is also input to the address generator 111, which generates an index address for distortion compensation table 110, and the clock (CLK)-unit delay circuit 124, as a reference signal, respectively.

The equalizer filter 114 controls its internal parameter (filter coefficient) to perform inverse characteristic filtering of the frequency characteristic of the input signal X(I, Q) as schematically shown in FIG. 8, so that the phases of the reference signal X(I, Q) and a feedback signal Y(I, Q) of an output of the amplifier 118, which are input to the LMS arithmetic operator 112, do not have frequency components. As a result, a linear inclination frequency characteristic of an analogue circuit is compensated for. In this instance, in FIG. 8, the input signal X(I, Q) is a multi carrier signal including four carriers of C1, C2, C3, and C4. FIG. 8 shows that the above-described filtering is capable of compensating for the frequency deviation of the power values of the carriers C1 through C4.

With this arrangement, the phase relationship of each carrier signal component (C1, C2, C3, and C4) on the frequency axis between the reference signal X(I, Q) and the feedback signal Y(I, Q) becomes constant, the DPD operation ability being thereby improved. In this instance, although FIG. 7 does not illustrate it, the equalizer filter 114 is connected to the CPU 129 via the bus 128, and the above-mentioned filter coefficient is controlled by the CPU 129.

The signal, whose frequency characteristic is compensated for by the equalizer filter 114 as described above, is converted into an analogue signal by the D/A converter 115, and is then modulated (quadrature modulation) by the quadrature modulating unit 116 based on an output of the local oscillator 117, and is input to the amplifier 118 as a signal in a radio frequency (RF) band. The input signal is amplified by the amplifier 118 up to a required power value (transmission power value), and is then output.

A part of the output signal is split by the directional coupler 119, and is fedback to the mixer 120, which multiplies the split signal by an output of the local oscillator 121, thereby demodulating (quadrature detection) the signal. The demodulated signal is output as a signal in an IF band, and is then converted into a digital signal (complex signal) Y(I, Q) by the A/D converter 122. After that, the signal is input to the 1/M clock (CLK)-unit delay circuit 123, the FFT arithmetic operator 126, and the integrator 127, respectively.

As schematically shown in FIG. 9, for example, the 1/M clock-unit delay circuit (digital filter) 123 delays the feedback signal Y(I, Q) so that the above feedback signal Y(I, Q) and the reference signal X(I, Q) are input to the subtractor 125 at the same timing. For this purpose, the 1/M clock-unit delay circuit 123 is capable of delaying the feedback signal Y(I, Q) with an accuracy of 1/M clock, by controlling its internal parameter [a filter (tap) coefficient of a delay filter tap from 0 to (M−1): M is an arbitrary number]. The 1/M clock-unit delay circuit 123 delays the feedback signal Y(I, Q) by a desired time Δt in 1/M clock units, and inputs the delayed signal Y (I, Q) to the subtractor 125. The reference signal X(I, Q) is delayed by the clock-unit delay circuit 124 in clock units, and is then input to the subtractor 125.

That is, to realize comparison of signals of the same time by the subtracter 125, these delay circuits 123 and 124 separately delay the reference signal X(I(t−n), Q(t−n)) and the feedback signal Y(I(t−Δt), Q(t−Δt)), which are deviated in a time relationship, to make the two signals match on the time axis with good accuracy. At that time, the delay amount Δt (fine adjustment), which is smaller than a clock frequency, is delayed by the digital filter 123. In this instance, this digital filter 123 is also connected to the CPU 129 via the bus 128, and the CPU 129 controls the internal parameter (filter coefficient) of the digital filter 123, thereby controlling a delay amount.

Then, the subtracter 125 performs subtraction processing on the signals X (I, Q) and Y (I, Q) of the same time, whose input timings are matched due to the above delay adjustment, thereby detecting an error signal. On the basis of the error signal, the distortion compensation arithmetic operator 112 updates distortion compensation coefficients in the distortion compensation table 110 using, for example, the LMS algorithm.

As described above, the DPD amplifier adaptively updates a distortion compensation coefficient used in distortion compensation (multiplier 113) of the input signal X (I, Q) based on a difference (error) between the reference signal X(I, Q) and the feedback signal Y(I, Q), and compensates for nonlinear distortion of the amplifier 118, thereby improving the amplification efficiency.

Here, internal parameters (filter coefficients) of the equalizer filter 114 and the digital filter 123 are adaptively corrected by the CPU 129. That is, the FFT arithmetic operator 126 performs FFT processing on the feedback signal Y(I, Q), thereby performing frequency analysis. From the result (FFT result data), the CPU 129 obtains data equivalent to ACLR (Adjacent Channel Leakage Ratio) 5 MHz carrier separation under the 3GPP standards.

For example, in a case where data (data of frequency vs. power value) shown in FIG. 11 is obtained as the FFT result data, the CPU 129 obtains data of measurement points (monitoring range) indicated by the frames 100 whose center frequency is apart from the center frequency of the power value obtaining points indicated by the frames 200 by 5 MHz in the central direction. In this instance, in FIG. 11, the power value obtaining points 200 indicate ranges of power values obtained by an integration operation by the integrator 127; C1, C2, C3, and C4 designate carrier signal components already described.

As schematically shown in FIG. 10, of the data obtained at the above-mentioned measurement points 100, the CPU 129 compares high-frequency data with low-frequency data, and regards the worse data (data with a greater distortion deterioration amount within the monitoring range) as distortion data. The CPU 129 obtains the distortion data while changing the above-mentioned parameters, and corrects the parameters so that the distortion data is improved. Here, with the construction shown in FIG. 7, the distortion amount is not only changed by changing the parameters, and the distortion amount difference becomes definite by updating distortion compensation coefficients in the distortion compensation table 110.

In this instance, the integrator 127 integrates the feedback signal Y(I, Q), and notifies the CPU 129 of the power value (the power value obtained at the power value obtaining points 200 in FIG. 11) via the bus 128, thereby making it possible for the CPU 129 to detect abnormal transmission power and to output an alarm.

As a previous DPD art, there is an art proposed in the following patent document 1.

The object of the art in patent document 1 is to provide a linear power amplifier and a linear power amplification method which are low in change over time and in change due to temperature and which is high in distortion amount. The art in patent document 1 also intends to provide a method for setting of a digital pre-distorter. To realize the above objects, the DPD generates a predistortion-added signal to which odd number order distortion due to power series model is given, and extracts, from an amplifier output, an odd number order distortion component of the power series model from a pilot signal component.

That is, a pilot signal component is extracted from the output of the power amplifier, and odd number order distortion of power series model of the digital pre-distorter is directly feedback controlled, so that the level of the odd number order distortion component extracted from the pilot signal component becomes small. As a result, it is possible to provide a linear power amplifier with small changes over time and small changes due to temperature. The odd number order distortion is compensated for by the inverse characteristics of the frequency characteristics of the power amplifier, so that distortion of the power amplifier can be removed across a wide band.

[Patent Document1] Japanese Patent Application Laid-open No. 2005-65211

However, in cases where the amplifier distortion is great before distortion compensation, the distortion compensation cannot sufficiently work. For this reason, it is sometimes impossible to satisfy the radio characteristics as a transmitter simply by obtaining data equivalent to ACLR 5 MHz carrier separation. For example, as shown in FIG. 12, even if the specification of ACLR 5 MHz carrier separation of 3GPP can be satisfied, more stricter specification at more distant frequency falls outside the ACLR 10 MHz carrier separation specification.

That is, it is insufficient to obtain data equivalent to ACLR 5 MHz carrier separation as a parameter correction operation, and distortion data measurement at an appropriate point (frequency) meeting the ACLR specification is necessary. In this instance, the above patent document 1 does not disclose or suggest that setting of an appropriate distortion data measuring point in accordance with the ACLR specification is necessary.

SUMMARY OF THE INVENTION

With the foregoing problems in view, it is an object of the present invention to make it possible to set (control) an appropriate distortion data measuring point (to-be-detected frequency component) in accordance with multiple different specification values (for example, ACLR specification values) relating to the distortion amount, so that desired radio characteristics are satisfied even under a condition where the amplifier distortion is too large to be sufficiently compensated for.

In order to accomplish the above object, according to the present invention, the following distortion compensating apparatus and distortion compensating method are provided.

(1) As a generic feature, there is provided a distortion compensating apparatus which compensates for nonlinearity of an amplifier by adaptively updating a distortion compensation coefficient for an input signal input to the amplifier based on a difference between an input signal and an output signal of the amplifier, the apparatus comprising: a distortion amount detecting means which detects the amount of distortion of an output signal of the amplifier; a parameter holding means which holds a parameter having been set therein, the parameter holding means being capable of varying the difference according to the parameter set therein; a parameter correcting means which corrects the parameter held in the parameter holding means in such a manner that the distortion amount detected by the distortion amount detecting means is improved; control means which controls frequency components to be subjected to distortion amount detection that is performed by the distortion amount detecting means, based on the distortion amounts of a plurality of different frequency components of the output signal of the amplifier and on specification values relating to the distortion amounts.

As a preferred feature, the control means includes: a detecting unit which detects the distortion amounts of the plurality of frequency components of the output signal of the amplifier; a weighting factor multiplying unit which multiplies the plurality of distortion amounts detected by the detecting unit by weighting factors corresponding to the specification values relating to the distortion amounts of the frequency components; a detected frequency component setting unit which sets a frequency component with the greatest distortion amount, among the multiplication results obtained by the weighting factor multiplying unit, as the frequency component to be subjected to distortion amount detection by the distortion amount detecting means.

(3) As another preferred feature, the control means includes: a difference detecting unit which detects distortion amount differences among the plurality of frequency components in a specific frequency band of the output signal of the amplifier, and a detected frequency component changing unit which changes the frequency component to be subjected to distortion amount detection by the distortion amount detecting means according to the differences detected by the difference detecting unit and the specification values.

(4) Further, as yet another preferred feature, when the specification values are set to become smaller as the values are more distant from a carrier signal component of the output signal of the amplifier on a frequency axis (domain), the detected frequency component changing unit changes the frequency component to be detected so that the frequency component becomes more distant from the carrier signal component on the frequency axis (domain) as the difference is smaller.

(5) As another generic feature, there is provided a distortion compensating method for compensating for nonlinearity of an amplifier by adaptively updating a distortion compensation coefficient for an input signal input to the amplifier based on a difference between an input signal and an output signal of the amplifier, the method comprising the steps of: (a) detecting the amount of distortion of an output signal of the amplifier; (b) correcting the parameter held in parameter holding means, which holds a parameter having been set therein, the parameter holding means being capable of varying the difference according to the parameter set therein, in such a manner that the distortion amount detected by the step (a) is improved; and (c) controlling frequency components to be subjected to distortion amount detection that is performed by the step (a), based on the distortion amounts of a plurality of different frequency components of the output signal of the amplifier and on specification values relating to the distortion amounts.

In the present application, it is possible to set and control an appropriate frequency component to be detected (distortion measuring point) in accordance with the specification values related to the distortion amount for multiple different frequency components of the output signal of the amplifier. Thus, appropriate distortion monitoring in a wide band is realized. As a result, it is possible to optimize the aforementioned parameter with distortion deterioration outside the distortion measuring point suppressed. Accordingly, even an amplifier which cannot have a sufficient specification margin with respect to the above-mentioned specification values, satisfies desired radio characteristics.

Other objects and further features of the present invention will be apparent from the following detailed description when read in conjunction with the accompanying drawings.

BRIEF DESCRIPTION OF THE DRAWINGS

FIG. 4(A) and FIG. 4(B) are schematic diagrams for describing an operation (distortion measurement point determination processing due to weight assignment) of the CPU of FIG. 1;

FIG. 6(A) through FIG. 6(C) are each schematic diagrams for describing distortion measurement point setting processing relating to the modified example;

DESCRIPTION OF THE PREFERRED EMBODIMENT(S)

[A] First Embodiment

Figure 1:
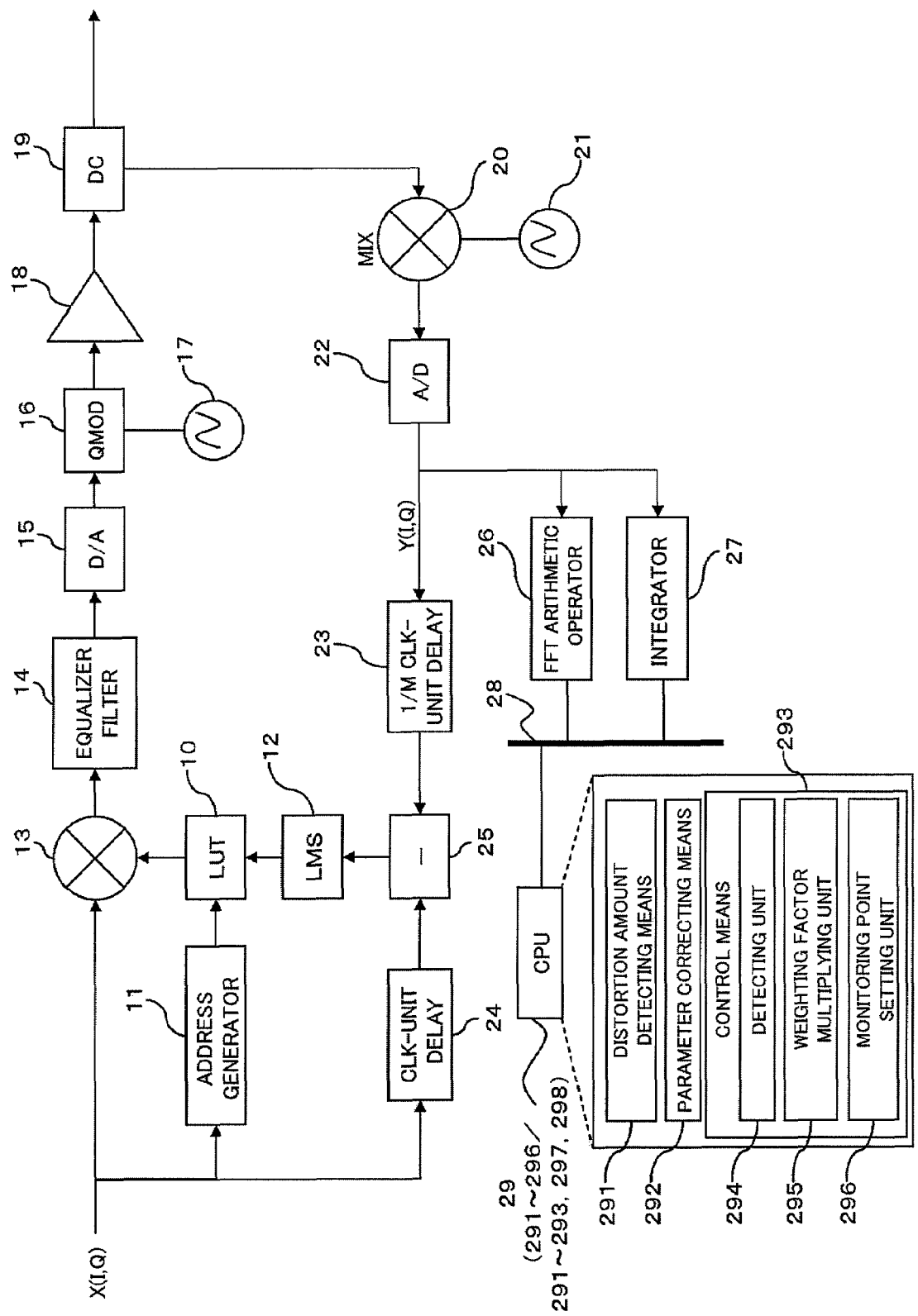
FIG. 1 is a block diagram showing a construction of an important part of a Digital Predistortion (DPD) amplifier (distortion compensating apparatus) according to a first embodiment of the present invention.

FIG. 1 is a block diagram showing a construction of an important part of a digital predistortion amplifier (distortion compensating apparatus) according to a first embodiment of the present invention. The DPD amplifier of FIG. 1 also includes: a Lookup Table (LUT: distortion compensation table) 10; an address generator 11; an LMS arithmetic operator (distortion compensation arithmetic operation unit) 12; a multiplier 13; an equalizer filter (complex filter) 14; a digital/analogue (D/A) converter 15; a quadrature modulation unit (QMOD) 16; a local oscillator 17; an amplifier 18; a directional coupler 19; a mixer (multiplier) 20; a local oscillator 21; an analogue/digital (A/D) converter 22; a 1/M-clock (CLK) unit delay circuit 23; a clock (CLK)-unit delay circuit 24; a subtractor 25; an FFT arithmetic operator 26; an integrator 27; a bus 28; and a CPU 29. In this instance, the DPD amplifier is applicable to, for example, a transmitter system (radio transmitter) of a base station apparatus. Further, an input signal (transmission signal) may be a single carrier signal or a multi-carrier signal. Here, it is assumed that an input signal is a multi-carrier signal.

Here, the distortion compensation table 10 stores distortion compensation coefficients, which are for compensating for distortion beforehand that can be caused when an input signal (complex signal) X(I, Q) (hereinafter also simply called X), a digital signal, is amplified by the amplifier 18. The coefficients are stored separately, for example, for power values of the input signal X. A distortion compensation coefficient of an address generated and specified by the address generator 11 based on the power value of the input signal X is supplied to the multiplier 13. The distortion compensation coefficients are adaptively updated in accordance with an arithmetic operation result obtained by the distortion compensation arithmetic operator 12.

The address generator 11 receives an input signal X as a reference signal, and generates an index address for the distortion compensation table 10 according to the power value of the input signal. The distortion compensation arithmetic operator 12 adaptively updates distortion compensation coefficients in the distortion compensation table 10 based on a difference (error signal) between the reference signal X obtained by the subtracter 25 and a feedback signal (complex signal; detailed below) Y(I, Q)(hereinafter also simply called Y).

Figure 8:
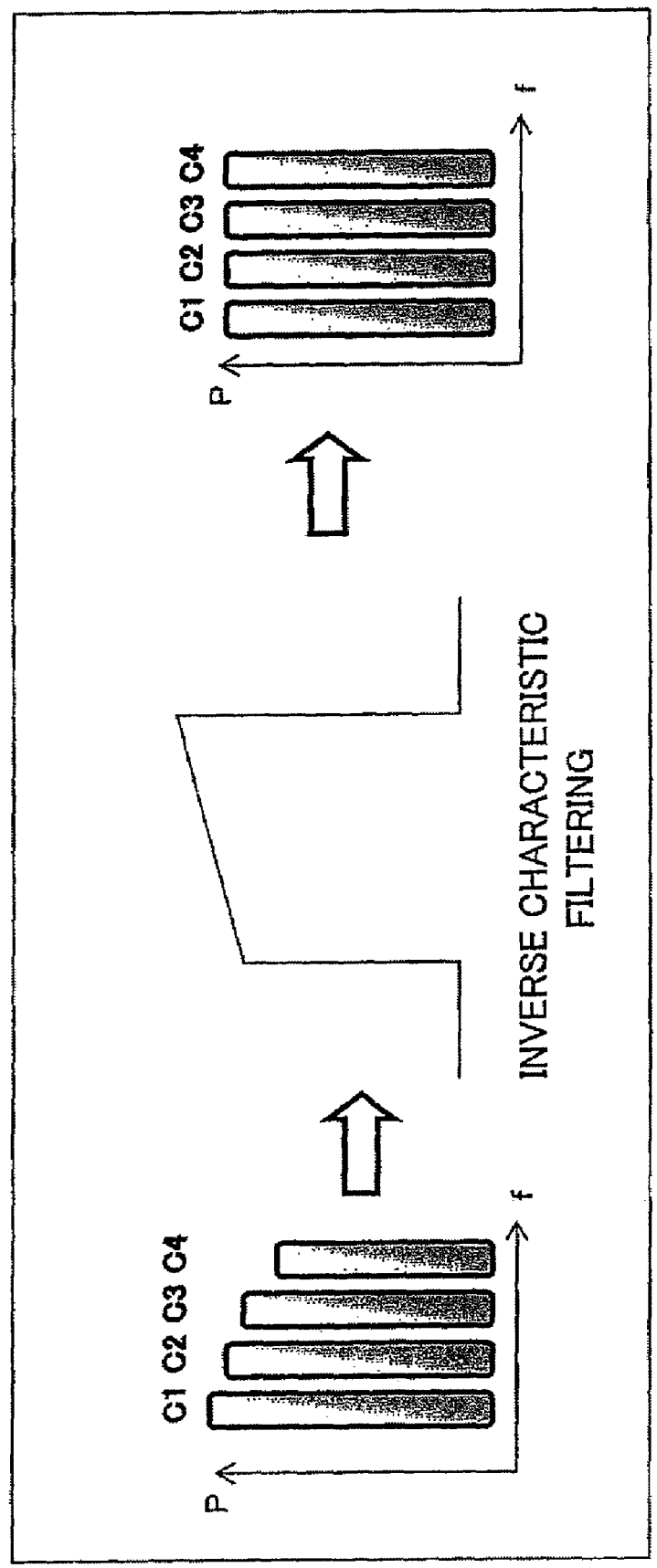
FIG. 8 is a schematic diagram for describing a function of an equalizer filter shown in FIG. 7.

The multiplier (distortion compensating unit) 13 multiplies the input signal X by a distortion compensation coefficient from the distortion compensation table 10, thereby compensating beforehand for distortion which can be caused when the input signal X is amplified by the amplifier 18. The equalizer filter (complex filter) 14 is a parameter holding means which holds a parameter set therein. The equalizer filter 14, which is formed by, for example, a digital filter, can vary a difference detected by the subtracter 25 according to the parameter [filter (tap) coefficient] set therein. As already described with reference to FIG. 8, the above-mentioned internal parameter of the equalizer filter 14 is controlled, so that the equalizer filter 14 performs inverse characteristic filtering on the frequency characteristic of the input signal X, to compensate for the linear inclination frequency characteristic of an analogue circuit (frequency deviation of each carrier signal component), thereby making the phase relationship of each carrier signal component constant.

In this instance, the equalizer filter 14 has, for example, several tens of tap coefficients, and is capable of compensating for a linear inclination characteristic of a few dB, which can occur in a signal band (for example, several tens MHz width) to be amplified. In addition, the equalizer filter 14 is connected to the CPU 29 via the bus 28 (not illustrated in FIG. 1), and the above-mentioned parameter is under control of the CPU 29.

The D/A converter 15 converts an output signal of the equalizer filter 14 into an analogue signal. The quadrature modulation unit 16 modulate (quadrature modulation) the analogue signal using a frequency signal from the local oscillator 17. The amplifier 18 amplifies the modulated signal obtained by the above modulation so that the modulated signal has a desired transmission power value.

The directional coupler 19 splits a part of an output of the amplifier 18 to feedback it to the mixer 20. The mixer 20 multiplies a feedback signal from the directional coupler 19 by a frequency signal from the local oscillator 21, thereby demodulating (quadrature detection) the feedback signal to generate a demodulation signal of an IF band. The A/D converter 22 converts the modulation signal into a digital signal, thereby obtaining a feedback signal Y(I, Q), which is a complex digital signal.

The 1/M-clock unit delay circuit 23 is a digital filter circuit (M is an arbitrary value, and delay filter taps of 0 through (M−1) are prepared) which is capable of delaying the feedback signal Y with an accuracy of 1/M clock so that the input timing of the feedback signal Y matches the input timing of the reference signal X. The 1/M-clock unit delay circuit 23 delays the feedback signal Y by a required time $\Delta t$ with an accuracy of 1/M clock unit and inputs the delayed signal to the subtractor 25. The clock-unit delay circuit 24, which is formed by, for example, one or more flip-flops (FFs), delays the reference signal X in clock units and inputs the delay signal to the subtractor 25.

Figure 9:
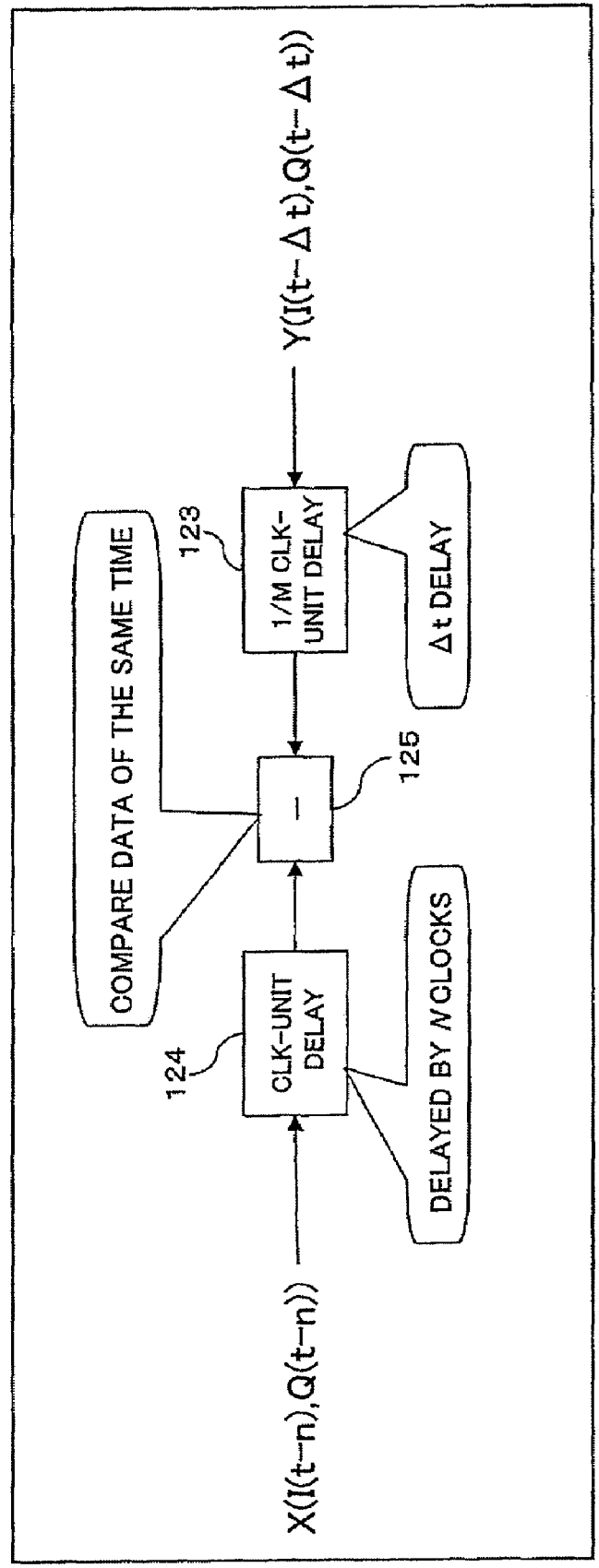
FIG. 9 is a diagram for describing a function of a delay circuit shown in FIG. 7.
Figure 10:
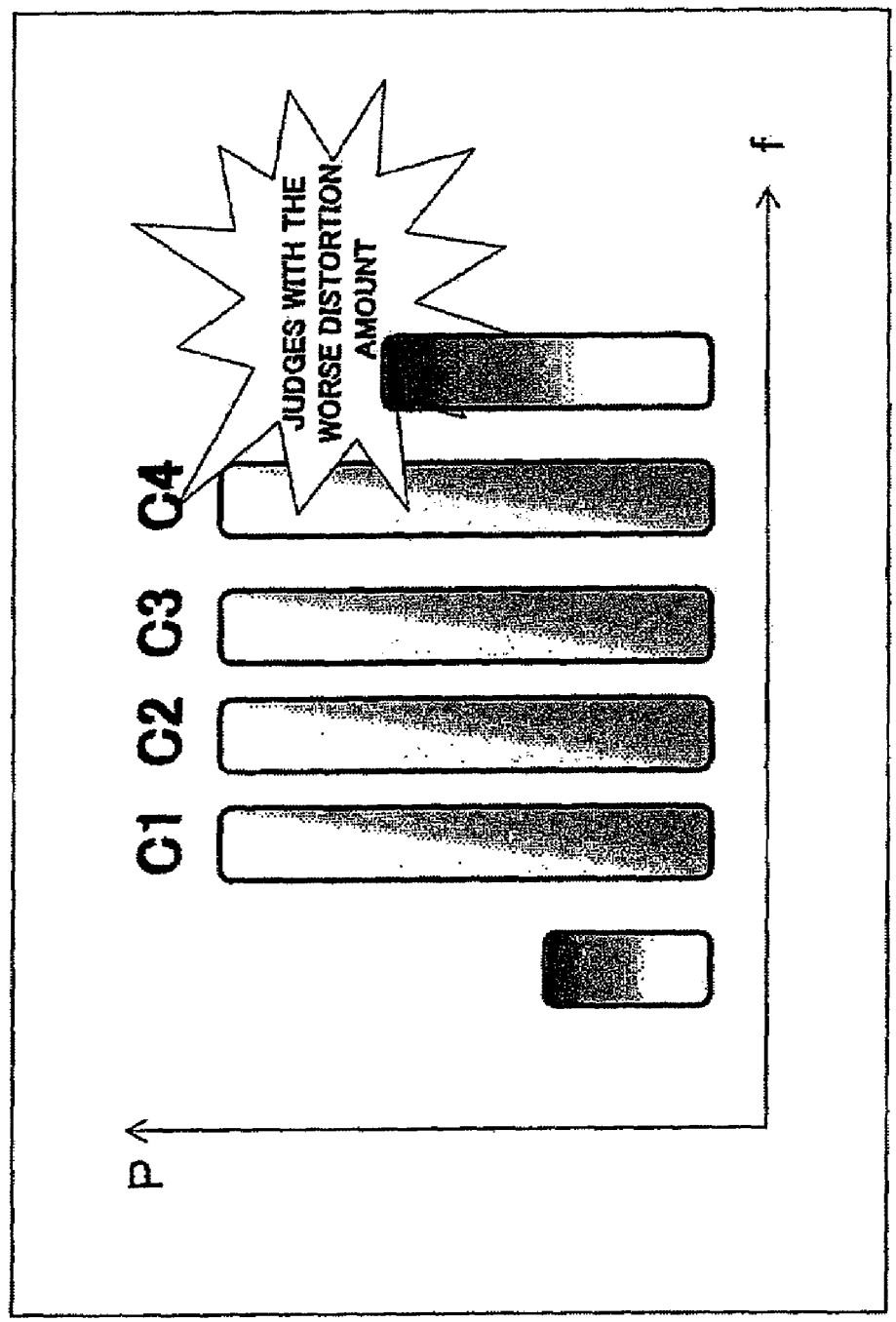
FIG. 10 is a schematic diagram for describing acquisition of distortion data by a CPU shown in FIG. 7.

That is, as already described with reference to FIG. 9, in order to realize comparison of signals of the identical time by the subtractor 25, the delay circuits 23 and 24 serve as a delay adjusting unit (a timing adjusting unit which adjusts comparison timing at the subtracter 25) which separately delays the reference signal X(I(t−n), Q(t−n)) and the feedback signal Y(I(t−$\Delta t$), Q(t−$\Delta t$)), which have a time lag therebetween, to make both signals match each other with good accuracy on the time axis. At that time, a delay of $\Delta t$ (fine adjustment), which is smaller than a clock frequency, is delayed by controlling an internal parameter [filter (tap) coefficient] of the 1/M-clock unit delay circuit 23.

In other words, the 1/M-clock unit delay circuit 23 is also a parameter holding means which is capable of varying a difference detected by the subtracter 25 according to a parameter set therein. In this instance, the digital filter 23 is also connected to the mixer CPU 29 via the bus 28, and the CPU 29 controls the internal parameter (filter coefficient) of the 1/M-clock unit delay circuit 23, thereby controlling the delay amount of the 1/M-clock unit delay circuit 23.

The subtractor (difference detecting unit) 25 performs subtraction processing on the reference signal X and the feedback signal Y of the same time, whose input timings are matched by the above-mentioned delay adjustment, thereby detecting a difference (error signal) therebetween. On the basis of the difference, the distortion compensation arithmetic operator 12 updates distortion coefficients in the distortion compensation table 10 using, for example, the LMS algorithm.

Figure 11:
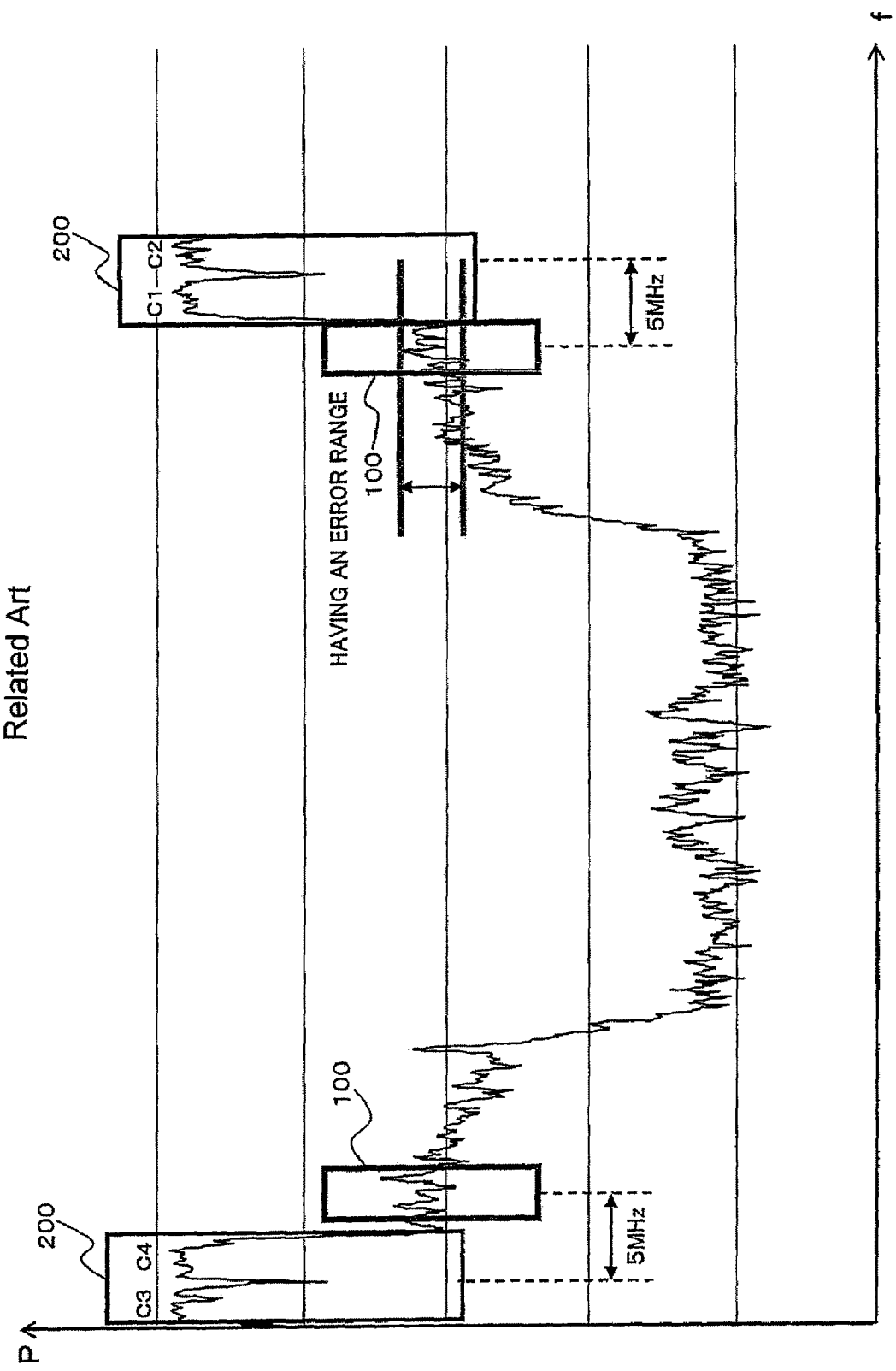
FIG. 11 is a diagram showing an example of an arithmetic operation result (FFT result data) obtained by an FFT arithmetic operator shown in FIG. 7.
Figure 12:
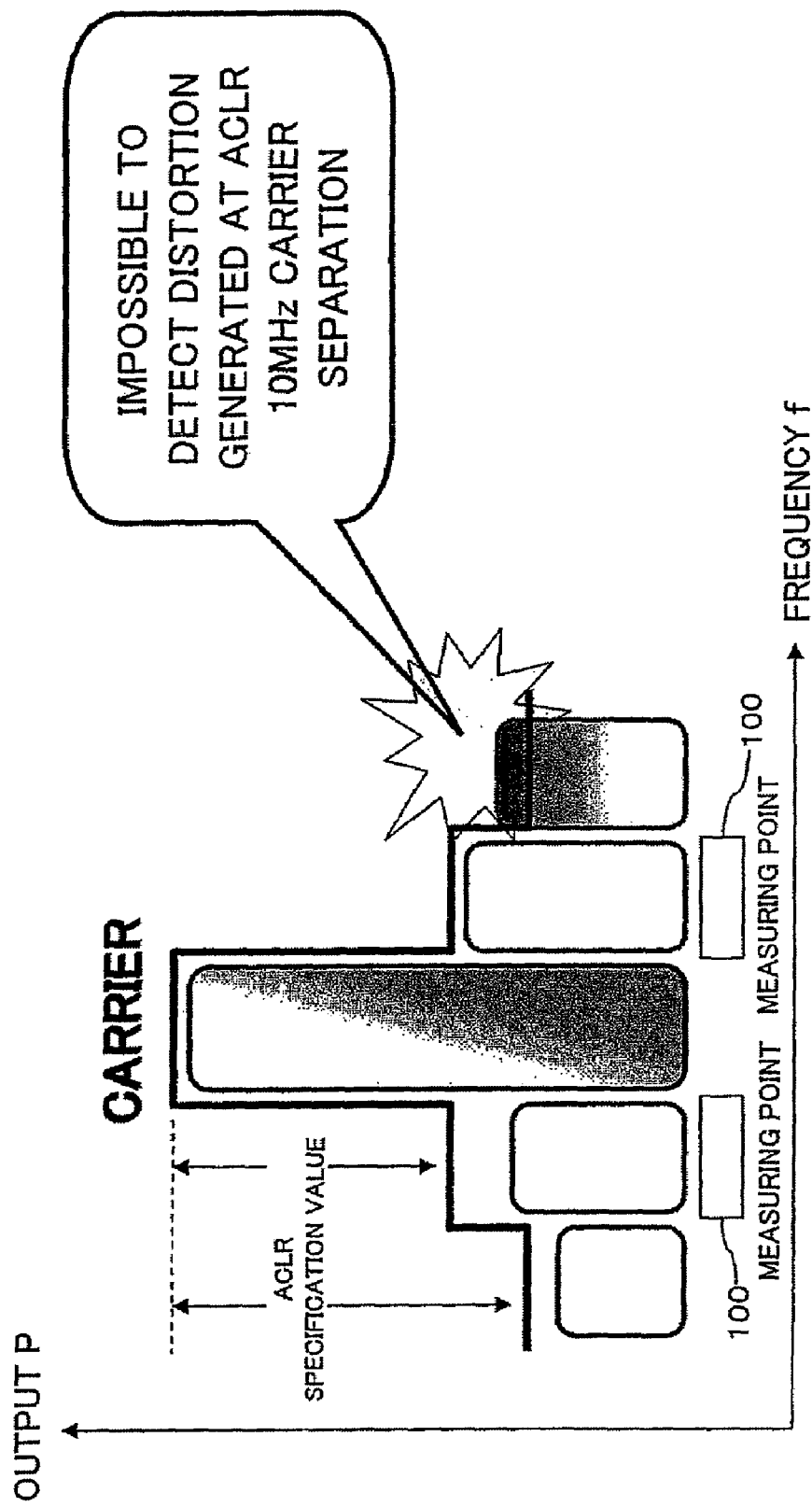
FIG. 12 is a schematic diagram for describing problems of a previous DPD amplifier.

The FFT arithmetic operator 26 receives an FFT execution instruction from the CPU 29 via the bus 28 and executes FFT processing on the feedback signal Y to carry out frequency analysis. The analysis result (FFT result data; see, for example, FIG. 11) can be obtained by the CPU 29 via the bus 28. The integrator (power monitoring means) 27 integrates the feedback signal Y for a specified time period, thereby detecting (monitoring) the power value (for example, the power value at power value obtaining points 200 in FIG. 11), and the detection result can be obtained by the CPU 29 via the bus 28.

The CPU 29 obtains distortion data from the FFT result data obtained by the FFT arithmetic operator 26 while varying the aforementioned parameter, and corrects the parameter so that the distortion data is improved. In the present example, data is obtained at monitoring (measurement) points corresponding to the multiple different ACLR (Adjacent Channel Leakage Ratio) specification values. Data at the monitoring points are multiplied by weighting factors w(f) corresponding to the aforementioned ACLR specification values. Then, that data with a great amount of distortion deterioration is determined to be distortion data.

For example, as shown in FIG. 4(A), when the specification value (see reference character 31) at ACLR 5 MHz carrier separation is different from the specification value (see reference character 32) at ACLR 10 MHz carrier separation (the latter is a stricter specification value), the CPU 29 obtains data at four monitoring points #1, #2, #3, and #4 (monitoring points #2 and #3 are frequency components at ACLR 5 MHz carrier separation; monitoring points #1 and #4 are frequency components at ACLR 10 MHz carrier separation) corresponding to the different ACLR specification values with the carrier signal component frequency as a center. The CPU 29 multiplies the pieces of data by weighting factors w(f) (see solid line 33) corresponding to the ACLR specification values, more specifically, factors which make the ACLR specification values, which vary depending on the frequencies, seem to be equal across frequencies (a larger factor for a monitoring point with a stricter ACLR specification value). The CPU 29 compares the multiplication results, and determines the data with the greatest distortion (here, data at monitoring point #4) to be distortion data.

That is, the CPU 29 of the present embodiment realizes the following functions (see FIG. 1):

(1) a function as the distortion amount detecting means 291 for detecting the distortion amount of an output signal of the amplifier 19;

(2) a function as a parameter correcting means 292 for correcting parameters of equalizer filter 14 and 1/M clock unit delay circuit 23, which are parameter holding means, so that the thus detected distortion amount is improved;

(3) a function as a control means 293 for controlling monitoring points (that is, frequency component to be detected) at which the distortion amount detecting means 291 monitors the distortion amount, based on the above-mentioned distortion amounts for multiple different frequency components of the output signal of the amplifier 18 and the specification values relating to the distortion amounts.

The control means 293 further has the following functions:

(3a) a function as a detecting unit 294 for detecting the distortion amounts of the aforementioned multiple frequency components of an output signal of the amplifier 18;

(3b) a weighting factor multiplying unit 295 for multiplying the multiple distortion amounts detected by the detecting unit 294 by weighting factors w(f) corresponding to the ACLR specification values relating the above-mentioned distortion amounts of the frequency components;

(3c) a function as a monitoring point (frequency component to be detected) setting unit 296 for setting, as the aforementioned monitoring point by the distortion amount detecting means 291, a frequency component with the maximum distortion amount among the multiplication results obtained by the weighting factor multiplying unit 295.

Now, an operation of the distortion compensating apparatus with the above-described construction of the present embodiment will be detailed hereinbelow.

(A1) Basic Operation of the Whole Apparatus:

First of all, the multiplier 13 multiplies an input signal X by a distortion compensation coefficient provided by the address generating table 10, thereby compensating for distortion thereof. After distortion compensation, the input signal X is input to the equalizer filter 14. As already described, an internal parameter (filter coefficient) of the equalizer filter 14 is controlled by the CPU 29, and the equalizer filter 14 performs filtering with an inverse characteristic of the frequency characteristic of the input signal X, thereby compensating for a linear inclination frequency characteristic of an analogue circuit.

The signal after the above compensation performed thereon is converted into an analogue signal by the D/A converter 15, and is modulated (quadrature modulation) by the quadrature modulation unit 16 based on an output of the local oscillator 17, and is then input to the amplifier 18 as a signal in a radio frequency (RF) band. After that, the signal is amplified by the amplifier 18 up to a desired power value (transmission power value) before being output.

A part of the output signal is split by the directional coupler 19 and is fedback to the mixer 20, which multiplies the split signal by an output of the local oscillator 21, thereby demodulating (quadrature detection) the signal. The demodulated signal is output as a signal in an IF band, and is converted by the A/D converter 22 into a digital signal (complex signal) Y, and is then input into the 1/M-clock unit delay circuit 23, and the FFT arithmetic operator 26, and the integrator 27.

The 1/M-clock unit delay circuit (digital filter) 23 delays the feedback signal Y by a desired time Δt in 1/M clock units so that input timings of the feedback signal Y and the reference signal X to the subtractor 25 match each other. The reference signal X is delayed by the clock-unit delay circuit 24 in clock units, and is then input to the subtractor 25.

The subtractor 25 performs subtraction processing on the reference signal X and the feedback signal Y of the same time, whose input timings are matched by the above-mentioned delay adjustment, thereby detecting an error signal. On the basis of the error signal, the distortion compensation arithmetic operator 12 updates distortion coefficients in the distortion compensation table 10 using, for example, the LMS algorithm.

As described so far, according to the DPD amplifier of the present embodiment, also, on the basis of the difference (error) between the reference signal X and the feedback signal Y, a coefficient used in distortion compensation (multiplier 13) of the input signal X is adaptively updated, whereby nonlinear distortion of the amplifier 18 is compensated for, so that amplification efficiency is improved.

(A2) Operation of CPU 29

Here, internal parameters (filter coefficients) of the equalizer filter 14 and the 1/M-clock unit delay circuit 23 are adaptively corrected by the CPU 29. The CPU 29 of the present example operates following the flowcharts of FIG. 2 and FIG. 3, for example.

Figure 2:
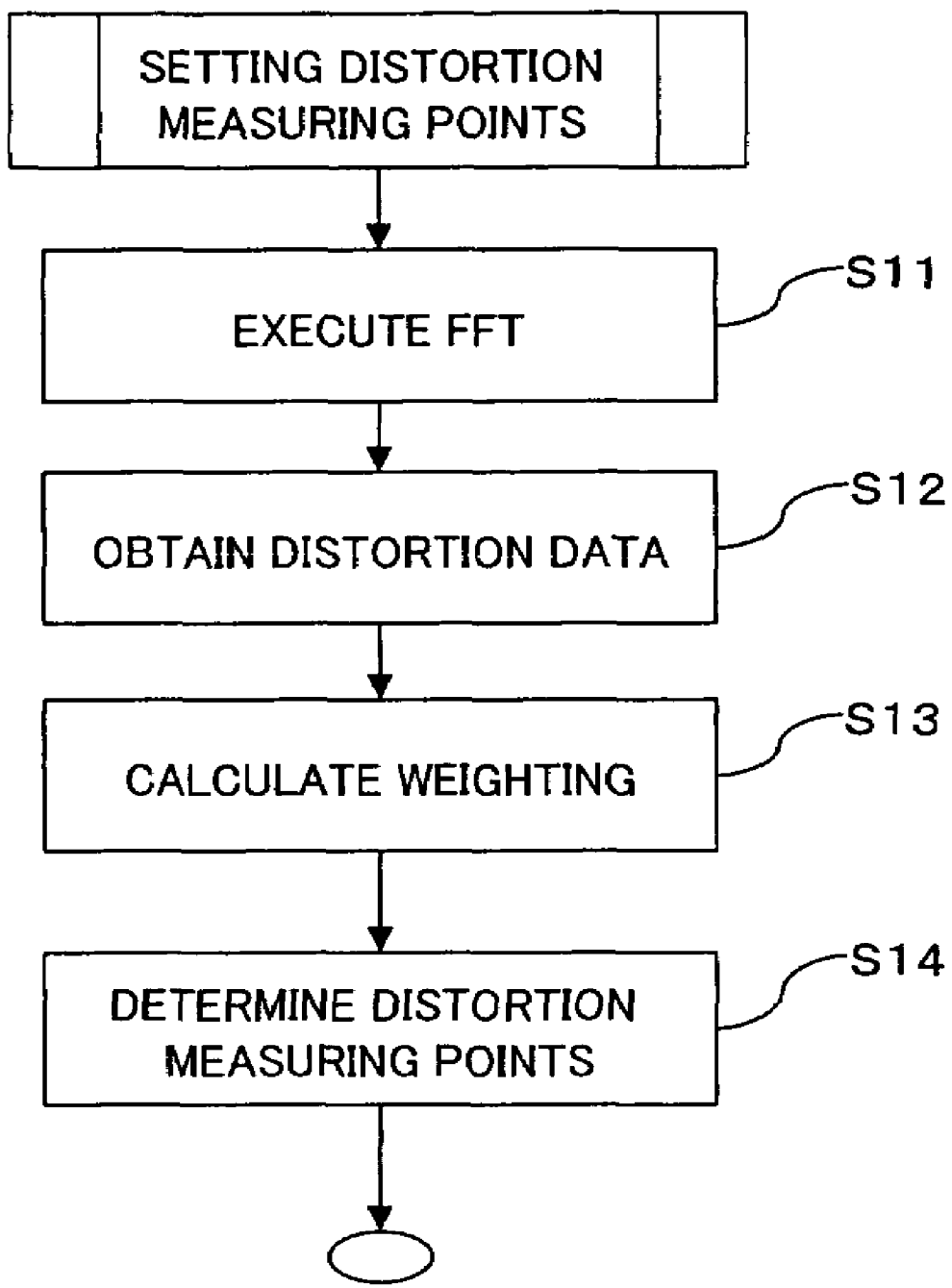
FIG. 2 is a flowchart for describing an operation (distortion measurement point setting processing) of a CPU shown in FIG. 1.

That is, as shown in FIG. 2, the CPU 29 (distortion amount detecting means 291 and detecting unit 294) regularly or irregularly gives an FFT execution instruction to the FFT arithmetic operator 26 through the bus 28, thereby activating the FFT arithmetic operator 26 to make it perform FFT processing onto the feedback signal Y (step S11). The CPU 29 obtains the result (FFT result data) of the FFT processing, and then obtains, from the FFT result data, the distortion data at multiple monitoring points corresponding to the multiple different ACLR specification values [step S12; (distortion amount) detecting step].

Then, the CPU 29 (the weighting factor multiplying unit 295 and the monitoring point setting unit 296) multiplies the distortion data obtained at each monitoring point by the above-mentioned weighting factor w(f) (step S13). After comparison of the result, the CPU 29 determines (sets) a monitoring point with the greatest distortion amount as a measuring point of the distortion data [step S14; controlling step (weighting factor multiplying step, to-be-detected frequency component setting step)].

Figure 3:
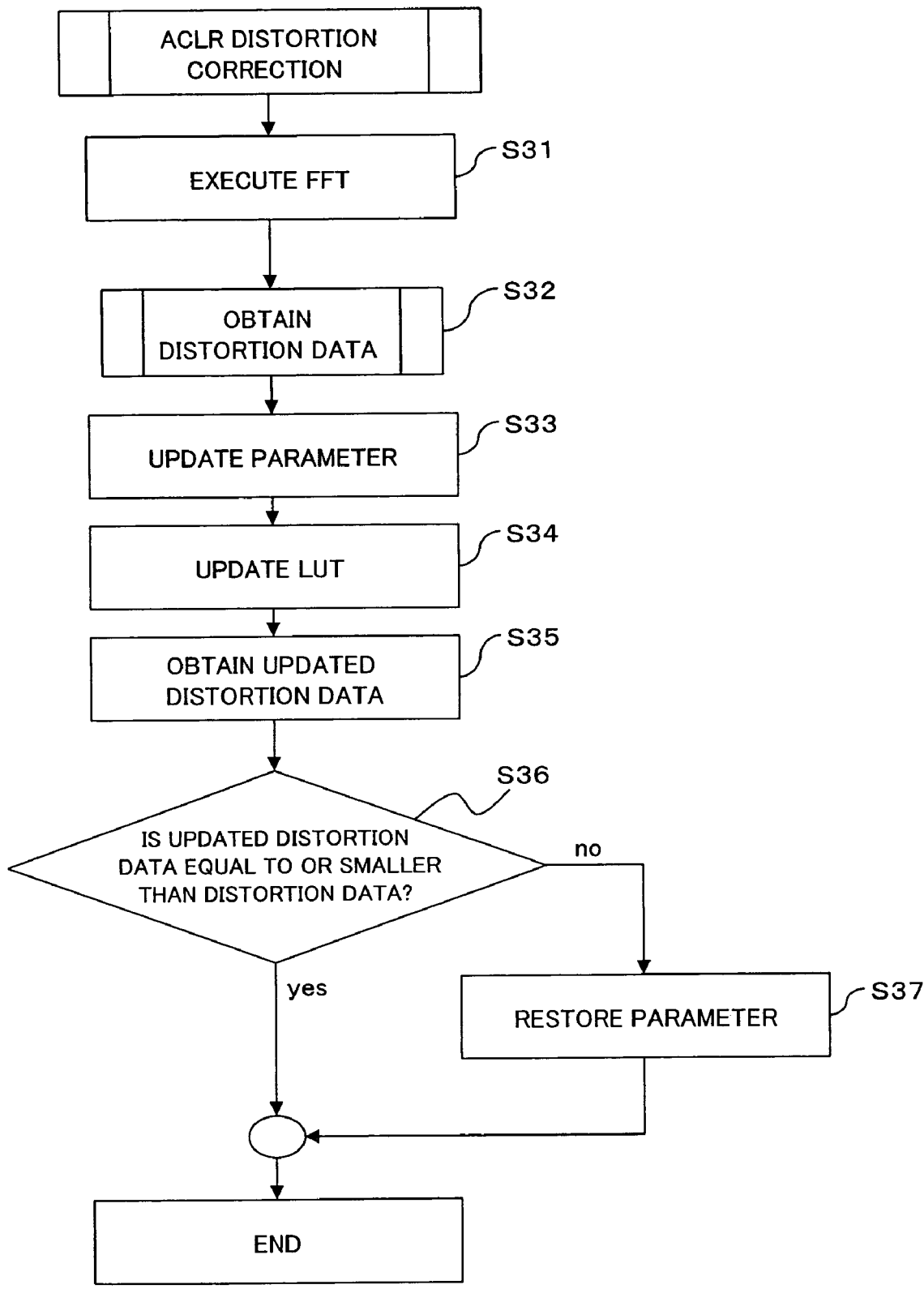
FIG. 3 is a flowchart for describing an operation (ACLR-type distortion correction) of a CPU shown in FIG. 1.

On the other hand, the CPU 29 (distortion amount detecting means 291 and parameter correcting means 292) regularly (or irregularly) activates and executes processing (ACLR-type distortion correction processing) shown in FIG. 3. The CPU 29 gives an FFT execution instruction to the FFT arithmetic operator 26 via the bus 28, thereby activating the FFT arithmetic operator 26 to make it execute FFT processing on the feedback signal Y (step S31). Out of the results (FFT result data), the CPU 29 obtains the distortion data at the measurement point determined in the above described manner (step S32; distortion amount detecting step), and on the basis of the distortion data, the CPU 29 updates (changes) the aforementioned parameters with a predetermined updating step width or the like (step S33; parameter correcting step).

As a result, distortion compensation coefficients in the distortion compensation table 10 are updated (step S34), and the CPU 29 regains distortion data (distortion updating data) at the same measuring point in a state after updating of the distortion compensation coefficients is performed (step S35).

Subsequently, the CPU 29 evaluates whether or not the above updated distortion data is equal to or smaller than the distortion data before being updated, which is obtained before updating of the distortion compensation coefficients (parameters) (step S36). If the updated distortion data exceeds the distortion data before being updated, it means that the above updating has increased (deteriorated) the distortion amount. Thus, the CPU 29 restores the parameters before being updated (from no route of step S36 to step S37). In contrast, if the above updated distortion data is equal to or smaller than the distortion data before being updated, it means that the distortion amount is improved or maintained. The CPU 29 thus maintains the parameter value after being updated, and ends the processing (yes route of step S36).

As described so far, according to the present embodiment, since weight assignment is performed to the distortion data at multiple monitoring points corresponding to the multiple different ACLR specification values and compared, it is possible to set an appropriate distortion measuring point corresponding to the ACLR specification. It is therefore possible to perform distortion monitoring in a wide band, so that internal parameters of the equalizer filter 14 and the 1/M clock unit delay circuit 23 are optimized, with the distortion deterioration of the measurement point restrained. Accordingly, even a distortion compensation amplifier which cannot have a sufficient specification margin with respect to the ACLR specification values, satisfies sufficient radio characteristics as a radio transmitter.

Here, in the above example, to obtain the distortion data for determining the monitoring point, and to obtain distortion data for parameter updating, FFT arithmetic operations are separately performed. However, the operation can be commonly performed (that is, on the basis of distortion data obtained at step S12 of FIG. 2, parameter updating at step S33 of FIG. 3 is performed).

(A3) Modification of the Embodiment:

In the above example, the optimum monitoring point is selected from the multiple monitoring points corresponding to the multiple different ACLR specification values. However, as shown in FIG. 6(C), for example, FFT result data at monitoring points (monitoring band) with a certain frequency width (for example, 5 MHz width) equivalent to ACLR 5 MHz carrier separation is divided into multiple points (band) on the frequency axis (here, 4 division with division points #1, #2, #3, and #4). The difference (that is, the tilt of the distortion data at the whole of the monitoring points) between the FFT result data (distortion data) at both ends, that is, point #1 and point #4, is detected, and the monitoring point can be shifted (changed) on the frequency axis according to its difference (tilt).

That is, when the above difference (tilt) is equal to or greater than the first threshold $\alpha 1$ [see FIG. 6(C)], the CPU 29 decides that the distortion amount closer to the carrier signal component is larger as shown in FIG. 6 (A), and the monitoring point is shifted (set) toward the carrier signal component side on the frequency axis. If the difference (tilt) is equal to or greater than the second threshold value $\alpha 2$ ($>\alpha 1$) [see FIG. 6(C)], the monitoring point is shifted (set) to the closest point to the carrier signal component on the frequency axis. In contrast, when the above difference is equal to or smaller than the third threshold $\alpha 0$ ($<\alpha 1$) [see FIG. 6(C)], the CPU 29 shifts (sets) the monitoring point so that it shifts away from the carrier signal component on the frequency axis as shown in FIG. 6(B) in order to monitor points at which ACLR specification values are stricter. As a result, it becomes possible to efficiently monitor distortion in a wider band.

The above functions are realized by preparing the following functions (see FIG. 1) in place of the already described means 294 through 296 as the control means 293 of the CPU 29:

(1) a function as a difference detecting unit 297 for detecting the difference of the distortion amount of the multiple frequency components in the specific frequency band of the output signal of the amplifier 18;

(2) a function as a monitoring point (frequency component to be detected) changing unit 298 for changing the monitoring point (frequency component to be detected) by the distortion amount detecting means 291 according to the difference detected by the difference detecting unit 297 and the ACLR specification values (more concretely, when, on the frequency axis, the ACLR specification values are set so as to become smaller as the values are more distant from the carrier signal component which is being output from the amplifier 18, the monitoring point becomes more distant away from the above-mentioned carrier signal component on the frequency axis as the above-mentioned difference is smaller.

Figure 5:
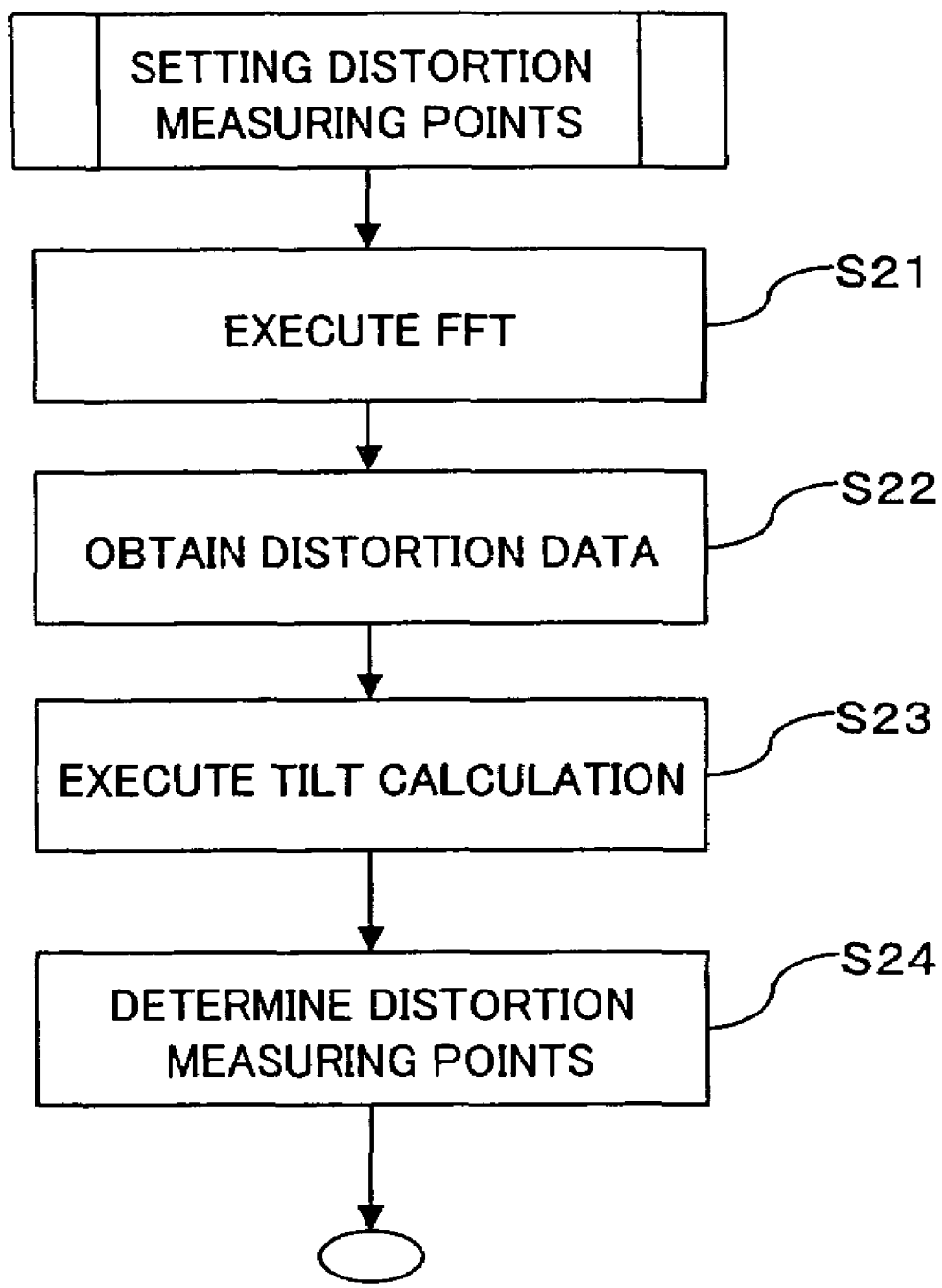
FIG. 5 is a flowchart of a modified example of distortion measurement point setting processing shown in FIG. 2.
Figure 7:
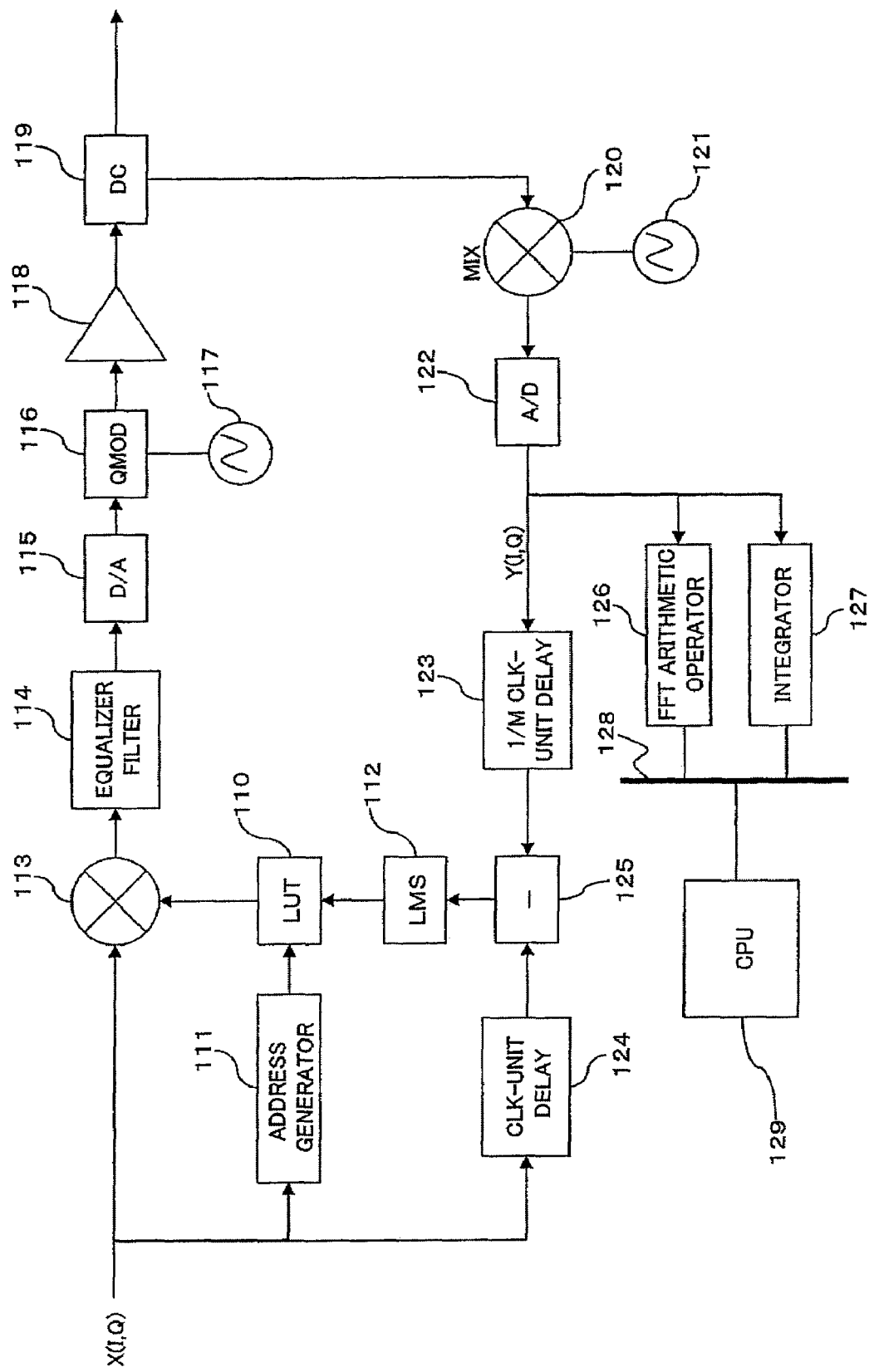
FIG. 7 is a block diagram showing a construction of an important part of a previous Digital Predistortion (DPD) amplifier.

Accordingly, the CPU 29 of the present example executes the processing (flowchart) shown in FIG. 5 in place of the processing (flowchart) shown in FIG. 2.

The CPU 29 [control means 293 (difference detecting unit 297)] regularly or irregularly gives an FFT execution instruction to the FFT arithmetic operator 26 through the bus 28, thereby activating the FFT arithmetic operator 26. In this manner, the CPU 29 makes the FFT arithmetic operator 26 perform FFT processing of the feedback signal Y (step S21), and obtains the result of the FFT processing (FFT result data) (step S22; distortion amount detecting step). The CPU 29 divides the FFT result data at an initial monitoring point (for example, a point at which distortion data corresponding to ACLR 5 MHz carrier separation can be obtained) into multiple division points on the frequency axis, and obtains the difference between the division points at both ends, thereby detecting (calculating) the tilt of the distortion data of the monitoring point as a whole [step S23; control step (difference detecting step)].

Then, the CPU 29 (monitoring point changing unit 298) compares the detected difference (tilt) with the threshold values ($\alpha 0$, $\alpha 1$, and $\alpha 2$), thereby determining the distortion data measurement point (monitoring point) as described with reference FIG. 6(A) through FIG. 6(C), and changes (sets) the monitoring point to the determined point [step S24; control step (to-be-detected frequency component changing step)].

On the other hand, in the present example, the CPU 29 periodically activates and executes the processing (ACLR-type distortion correction processing) shown in FIG. 3. The CPU 29 gives an FFT execution instruction to the FFT arithmetic operator 26 through the bus 28, thereby activating the FFT arithmetic operator 26 to make it perform FFT processing of the feedback signal Y (step S31). From the FFT processing result (FFT result data), the CPU 29 obtains the distortion data at the measurement point determined as described above (step S32; distortion amount detecting step), and updates (changes) the above-mentioned parameter with a specified updating step width based on the distortion data (step S33; parameter correcting step).

With this, the distortion compensation coefficients in the distortion compensation table 10 is updated (step S34). Under the state after the compensation coefficients have been updated, the CPU 29 regains the distortion data (distortion updating data) at the same measurement point (step S35), and evaluates whether or not the updated distortion data is equal to or smaller than the distortion data which is obtained before the distortion compensation coefficients are updated (step S36).

As a result, if the updated distortion data exceeds the distortion data before being updated, this means that the updating has increased (deteriorated) the distortion amount, and thus, the CPU 29 restores the parameter before being updated (no route of step S36 to step S37). In contrast, if the above updated distortion data is equal to or smaller than the distortion data before being updated, this means that the distortion amount is improved or retained, and thus, the CPU 29 retains the parameter value setting after the updating being performed, and ends the processing (yes route of step S36).

As described so far, in the present modified example, the distortion measurement point is set (controlled) to an appropriate point according to the tilt (difference) of the distortion data at a monitoring point in a certain frequency width and the ACLR specification values. Thus, appropriate distortion monitoring in a wider band is realized. As a result, optimization of the equalizer filter 14 and the 1/M clock unit delay circuit 23 is available, restraining the distortion deterioration outside the measurement point. Accordingly, even a distortion compensation amplifier which cannot have a sufficient specification margin with respect to the ACLR specification values, can satisfy satisfactory radio characteristics as a radio transmitter.

In this instance, in the present example, also, an FFT arithmetic operation can be commonly performed for obtaining distortion data for determining the monitoring point and for obtaining distortion data for parameter updating (that is, parameter updating at step S33 of FIG. 3 can be performed based on distortion data obtained at step S22 of FIG. 5).

Further, the present invention should by no means be limited to the above-illustrated embodiment, but various changes or modifications may be suggested without departing from the gist of the invention.

As detailed so far, according to the present invention, since an appropriate distortion measurement point is set and controlled according to the specification values relating to the distortion amount for multiple different frequency components of an output signal of the amplifier, appropriate distortion monitoring in a wide band is realized. As a result, optimization of the aforementioned parameter to satisfy the specification values in a wider band in comparison with the previous case, is available. Therefore, even under a state where the distortion of the amplifier is too large to be sufficiently compensated for, desired radio characteristics can be realized. Thus, the present invention is significantly useful in the radio communication technology field.

What is claimed is:

1. A distortion compensating apparatus which compensates for nonlinearity of an amplifier by adaptively updating a distortion compensation coefficient for an input signal input to the amplifier based on a difference between an input signal and an output signal of the amplifier, said apparatus comprising:

distortion amount detecting means which detects the amount of distortion of an output signal of the amplifier;

parameter holding means which holds a parameter having been set therein, said parameter holding means being capable of varying the difference according to the parameter set therein;

parameter correcting means which corrects the parameter held in said parameter holding means in such a manner that the distortion amount detected by said distortion amount detecting means is improved;

control means performing control such that a frequency component that is to be subjected to distortion amount detection to be performed by said distortion amount detecting means is selected from a plurality of different frequency components, based on results obtained by weighing a plurality of the distortion amounts of the plurality of different frequency components of the output signal of said amplifier in accordance with specification values relating to the distortion amounts.

2. A distortion compensating apparatus as set forth in claim 1, wherein said control means includes:

a detecting unit which detects the distortion amounts of said plurality of frequency components of the output signal of said amplifier;

a weighting factor multiplying unit which multiplies the plurality of distortion amounts detected by said detecting unit by weighting factors corresponding to the specification values relating to the distortion amounts of the frequency components;

a detected frequency component setting unit which sets a frequency component with the greatest distortion amount, among the multiplication results obtained by said weighting factor multiplying unit, as the frequency component to be subjected to the distortion amount detection by said distortion amount detecting means.

3. A distortion compensating apparatus as set forth in claim 1, wherein said control means includes:

a difference detecting unit which detects distortion amount differences among the plurality of frequency components in a specific frequency band of the output signal of said amplifier, and a detected frequency component changing unit which changes the frequency component to be subjected to the distortion amount detection by said distortion amount detecting means according to the differences detected by said difference detecting unit and the specification values.

4. A distortion compensating apparatus as set forth in claim 3, wherein, when the specification values are set to become smaller as the values are more distant from a carrier signal component of the output signal of said amplifier on a frequency domain, said detected frequency component changing unit changes the frequency component to be detected so that the frequency component become more distant from the carrier signal component on the frequency domain as the difference is smaller.

5. A distortion compensating apparatus as set forth in claim 1, wherein the specification values are specification values relating to ACLR (Adjacent Channel Leakage Ratio).

6. A distortion compensating apparatus as set forth in claim 2, wherein the specification values are specification values relating to ACLR (Adjacent Channel Leakage Ratio).

7. A distortion compensating apparatus as set forth in claim 3, wherein the specification values are specification values relating to ACLR (Adjacent Channel Leakage Ratio).

8. A distortion compensating apparatus as set forth in claim 4, wherein the specification values are specification values relating to ACLR (Adjacent Channel Leakage Ratio).

9. A distortion compensating method for compensating for nonlinearity of an amplifier by adaptively updating a distortion compensation coefficient for an input signal input to the amplifier based on a difference between an input signal and an output signal of the amplifier, said method comprising the steps of:

(a) detecting the amount of distortion of an output signal of the amplifier;

(b) correcting the parameter held in parameter holding means, which holds a parameter having been set therein, said parameter holding means being capable of varying the difference according to the parameter set therein, in such a manner that the distortion amount detected by said step (a) is improved; and (c) performing control such that a frequency component that is to be subjected to distortion amount detection to be performed by said step (a) is selected from a plurality of different frequency components, based on results obtained by weighing a plurality of the distortion amounts of the plurality of different frequency components of the output signal of said amplifier in accordance with specification values relating to the distortion amounts.

10. A distortion compensating method as set forth in claim 9, wherein said step (c) includes the steps of:

(c-1) detecting the distortion amounts of said plurality of frequency components of the output signal of said amplifier;

(c-2) multiplying the plurality of distortion amounts detected by said step (a) by weighting factors corresponding to the specification values relating to the distortion amounts of the frequency components;

(c-3) setting a frequency component with the greatest distortion amount, among the multiplication results obtained by said step (c-2), as the frequency component to be subjected to the distortion amount detection by said step (c-1).

11. A distortion compensating method as set forth in claim 9, wherein said step (c) includes the steps of:
(c-4) detecting distortion amount differences among the plurality of frequency components in a specific frequency band of the output signal of said amplifier, and
(c-5) changing the frequency component to be subjected to the distortion amount detection by said step (a) according to the differences detected by said step (c-4) and the specification values.

12. A distortion compensating method as set forth in claim 11, wherein, when the specification values are set to become smaller as the values are more distant from a carrier signal component of the output signal of said amplifier on a frequency domain, said step (c-5) changes the frequency component to be detected so that the frequency component becomes more distant from the carrier signal component on the frequency domain as the difference is smaller.

13. A distortion compensating method as set forth in claim 9, wherein the specification values are specification values relating to ACLR (Adjacent Channel Leakage Ratio).

14. A distortion compensating method as set forth in claim 10, wherein the specification values are specification values relating to ACLR (Adjacent Channel Leakage Ratio).

15. A distortion compensating method as set forth in claim 11, wherein the specification values are specification values relating to ACLR (Adjacent Channel Leakage Ratio).

16. A distortion compensating method as set forth in claim 12, wherein the specification values are specification values relating to ACLR (Adjacent Channel Leakage Ratio).

* * * * *